(12) United States Patent
Mori et al.

(10) Patent No.: US 7,710,070 B2
(45) Date of Patent: May 4, 2010

(54) BATTERY PACK APPARATUS AND METHOD OF CONTROLLING BATTERY PACK APPARATUS

(75) Inventors: Yasushi Mori, Kanagawa (JP); Hirohisa Okamura, Tokyo (JP)

(73) Assignee: Sony Corporation, Tokyo (JP)

( * ) Notice: Subject to any disclaimer, the term of this patent is extended or adjusted under 35 U.S.C. 154(b) by 331 days.

(21) Appl. No.: 11/682,614

(22) Filed: Mar. 6, 2007

(65) Prior Publication Data
US 2008/0166627 A1    Jul. 10, 2008

(30) Foreign Application Priority Data
Mar. 13, 2006    (JP) .......................... P2006-067810

(51) Int. Cl.
*H02J 7/00*    (2006.01)
(52) U.S. Cl. ...................... 320/112; 320/162; 320/136

(58) Field of Classification Search ................. 320/112, 320/162, 165, 134, 136; 429/61
See application file for complete search history.

(56) References Cited

U.S. PATENT DOCUMENTS 5,717,307 A * 2/1998 Barkat et al. ............. 340/636.1
2005/0134227 A1* 6/2005 Wozniak ..................... 320/134

FOREIGN PATENT DOCUMENTS

JP    64-059516    3/1989
JP    2000-357540    12/2000

* cited by examiner

*Primary Examiner*—Edward Tso
*Assistant Examiner*—Aaron Piggush
(74) *Attorney, Agent, or Firm*—Sonnenschein Nath & Rosenthal LLP

(57) ABSTRACT

A battery pack apparatus is provided. The battery pack includes a battery, a circuit board connected to the battery, and a detecting unit on the circuit board configured to detect a battery power line of the battery detached from the circuit board by detecting a battery voltage drop.

2 Claims, 3 Drawing Sheets

FIG. 4
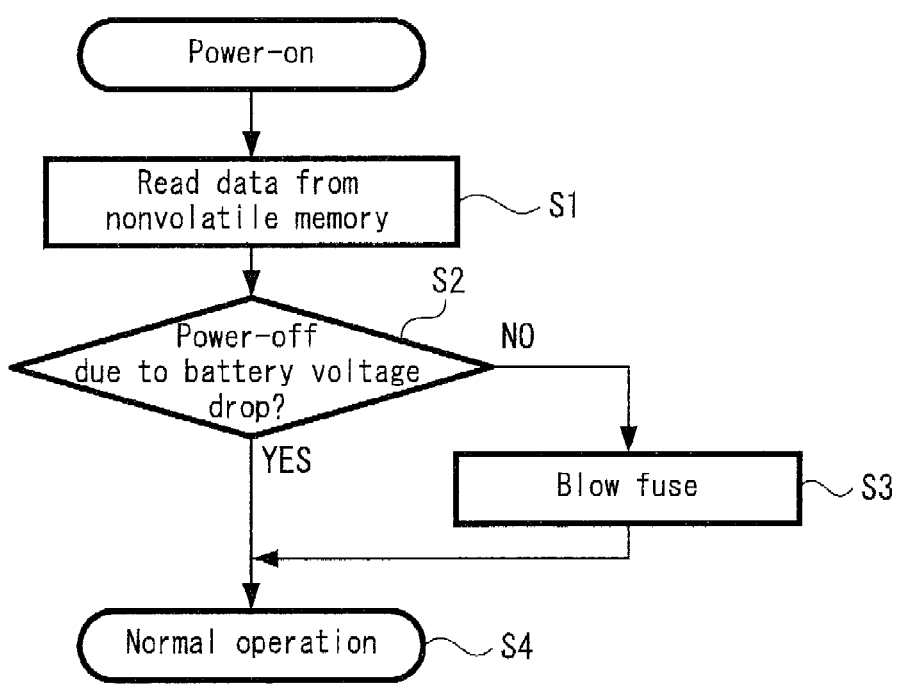
FIG. 5A
FIG. 5B
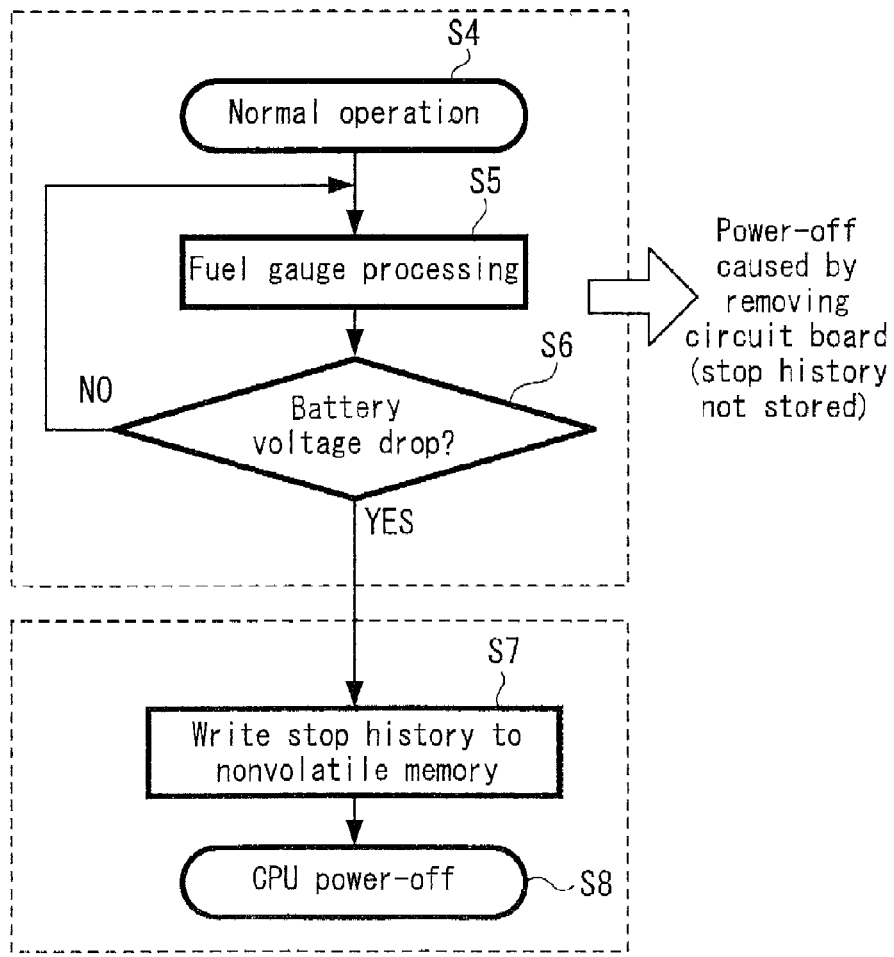

BATTERY PACK APPARATUS AND METHOD OF CONTROLLING BATTERY PACK APPARATUS

CROSS REFERENCES TO RELATED APPLICATIONS

The present invention contains subject manner related to Japanese Patent Application JP 2006-067810 filed in the Japanese Patent Office on Mar. 13, 2006, the entire contents of which being incorporated herein by reference.

BACKGROUND OF THE INVENTION

1. Field of the Invention

The present invention relates to a battery pack apparatus containing a primary or secondary battery, and a method of controlling the battery pack apparatus; in particular, the present invention relates to a battery pack apparatus capable of detecting a battery removed state, and a method of controlling the battery pack apparatus.

2. Description of the Related Art

There has been known a battery protection circuit that prohibits charge and discharge by blowing a thermal fuse using a heat element when abnormality such as overvoltage of a battery is detected. For example, Japanese Unexamined Patent Application Publication No. 2000-357540 discloses such battery protection circuit that blows the thermal fuse using a heat element and stops charge and discharge when overvoltage of a battery is detected.

Further, Japanese Patent No. 2576525 discloses a battery pack apparatus including a secondary battery detachable from an electronic apparatus. Characteristic data on the secondary battery stored in a nonvolatile memory incorporated in the battery pack apparatus are occasionally updated to obtain an accurate characteristic of the secondary battery. The above-described patent discloses a battery pack apparatus including a nonvolatile memory, while a computer (hereinafter described as CPU) based automatic measuring unit is provided to a charging apparatus. In the case where the battery pack apparatus is held by the charging apparatus, the number of charges, a discharge characteristic, and the like are automatically measured to calculate and display the capacity of the battery based on such data. Further, the data on the discharge characteristic and capacity are stored in the nonvolatile memory included in the battery apparatus. Therefore, battery life can be predicted, and the battery can be used economically and efficiently.

FIG. 1 is a diagram showing a system disclosed in Japanese Patent No. 2576525. A battery pack apparatus 1 stores a battery group (hereinafter described as a battery cell) 2 including, for example, a plurality of nickel-cadmium batteries connected in series as shown with a dotted line 2, and a nonvolatile memory 3 formed of, for example, an EEPROM. A connection terminal 4 led from the +(positive) electrode of the battery cell 2, a connection terminal 5 led from the −(negative) electrode thereof, and an input-output terminal 6 led from the nonvolatile memory 3 are provided to predetermined positions on the outside surface of a housing of the battery pack apparatus 1. A charging apparatus 7 includes an automatic measuring unit having a CPU 14, thereby automatically measuring the number of charges, a discharge characteristic, and the like.

An A/D converter 13, heater 21, cooler 22, switch circuit 15, display unit 19, switch group 23 and interface circuit 18 are connected to the CPU 14 that serves as a hub of the control, and an input-output terminal 10 is led from the CPU 14. Further, an external input-output terminal 20 is led from the interface circuit 18. It should be noted that, although not shown in the figure, the CPU 14 includes a ROM incorporating control software, input-output apparatus, and the like.

Further, a holding space 11 to store the battery pack apparatus 1 is formed in the charging apparatus 7. A connection terminal 8 led from a terminal 15a of the switch circuit 15, a terminal 9 led from a terminal 15b thereof, and the input-output terminal 10 led from the CPU 14 are provided to predetermined positions on the outside surface of the housing forming the holding space 11. The heater 21 and cooler 22 are provided on the outside surface of the housing forming the holding space 11, and further, a temperature sensor 12 is provided. The heater 21 and cooler 22 are driven by a control signal from the CPU 14, and turned on so that the charge of the battery cell 2 in the battery pack apparatus 1 is optimized under a temperature condition within a predetermined range.

A charge circuit 16 is connected between a terminal 15c and terminal 15f of the switch circuit 15, and a rated load 17 is connected between a terminal 15e and a terminal 15h. Further, a terminal 15d and terminal 15g of the switch circuit 15 are open. The switch circuit 15 has a control terminal to which a control signal is supplied from the CPU 14, and the predetermined terminal 15a (15b) is selectively connected to the terminals 15c, 15d, 15e (15f, 15g, 15h). Specifically, when charging, the terminal 15a is connected to the terminal 15c, and the terminal 15b is connected to the terminal 15f. Further, when measuring a discharge characteristic, the terminal 15a is connected to the terminal 15e, and the terminal 15b is connected to the terminal 15h. Except for charging and measuring the discharge characteristic, the terminal 15a is connected to the terminal 15d, and the terminal 15b is connected to the terminal 15g.

Further, the connection terminal 8 and temperature sensor 12 are connected to the A/D converter 13 connected to the CPU 14. Thus, data on the terminal voltage of the battery cell 2, an ambient temperature, and the like are input into the CPU 14 via the A/D converter 13, according to need. The CPU 14 enters various modes corresponding to the operations using the switch group 23, a signal indicating that the battery pack apparatus 1 has been stored in the holding space 11, and the like. Further, the CPU 14 conducts various kinds of processing so as to control respective units, prepares a display signal according to need, and supplies the display signal to the display unit 19 to display predetermined information.

For example, as shown by the dotted-line arrows, the connection terminal 4 of the battery pack apparatus 1 is connected to the connection terminal 8 of the charging apparatus 7, and the connection terminal 5 of the battery pack apparatus 1 is connected to the connection terminal 9 of the charging apparatus 7 in the state of the battery pack apparatus 1 being stored in the holding space 11. In addition, the input-output terminal 6 of the battery pack apparatus 1 is connected to the input-output terminal 10 of the charging apparatus 7, thereby coupling the nonvolatile memory 3 to the CPU 14. If an external input apparatus is connected to the external input-output terminal 20 in such state, the nonvolatile memory 3 is brought into a writing state. Subsequently, data indicating, for example, the name of administrator, start date of use, ID number, and the like are written from the connected external input apparatus, are supplied to the nonvolatile memory 3 and stored in a predetermined region thereof via the interface circuit 18 and CPU 14.

Further, upon storing the battery pack apparatus 1 in the holding space 11, the CPU 14 automatically retrieves data on the number of charges stored in the nonvolatile memory 3, and displays the number of charges on the display unit 19. If a charging mode is selected, the CPU 14 operates the heater 21 and cooler 22 based on the value supplied from the temperature sensor 12, controls the ambient temperature of the battery pack apparatus 1 to be an optimum temperature, and connects the charge circuit 16 to the battery cell 2 to charge in that state. Further, the CPU 14 obtains a value of the terminal voltage of the battery cell 2 and monitors the value. If more voltage drop than a predetermined level is detected, the CPU 14 terminates charging, updates a flag indicating the number of charges, and stores data on the number of charges and the like in the nonvolatile memory 3. Further, the CPU 14 is selectively in the discharge characteristic measurement mode once every predetermined number of times, connects the rated load 17 to the battery cell 2, obtains the terminal voltage, and collects data on the terminal voltage with a predetermined period until the terminal voltage decreases to a predetermined level. With the terminal voltage having the predetermined level and the discharge characteristic measurement having been over, the CPU 14 calculates and displays the battery capacity based on the data on the terminal voltage, and stores data on the discharge characteristic measurement and the battery capacity in the nonvolatile memory 3.

Various kinds of data intensively stored in the nonvolatile memory 3 through the above-mentioned processing are retrieved by the operation using the switch group 23 and processing steps at the CPU 14 according to need, and are input into the CPU 14. Display signals corresponding to the various data are prepared in the CPU 14, and supplied to the display unit 19 to be displayed as information by means of characters and the like. Further, in the case where an external output apparatus such as a printer is connected to the external input-output terminal 20, data stored in the nonvolatile memory 3 and data generated by the processing of the CPU 14 are retrieved according to need, and output in the form of hard copy. Hence, a user can readily determine the battery life comprehensively and can manage battery history by referring to such information as the battery capacity, number of charges, start date of use and the like displayed according to the processing steps and according to need.

SUMMARY OF THE INVENTION

The battery protection circuit for a battery pack apparatus described in Japanese Unexamined Patent Application Publication No. 2000-357540 prohibits charge and discharge by blowing a thermal fuse using a heat element, when abnormality such as overvoltage of a battery is detected. A battery apparatus having a nonvolatile memory described in the above-described patent reference automatically measures the number of charges, discharge characteristic, and the like, calculates and displays the capacity of the battery based on such data, and stores the data on the discharge characteristic and capacity in the nonvolatile memory in the battery pack apparatus, when having stored a battery in a charging apparatus. Hence, the battery life can be predicted, and the battery can be used economically and efficiently. However, if the battery pack apparatus including a battery and a circuit board connected to the battery is disassembled and a battery cell or the battery of this battery pack apparatus is replaced with another battery cell or a different kind of battery, it is difficult to detect abnormal states of the replacing battery cell or replacing battery. Specifically, the replacing battery cell or replacing battery, particularly a lithium-ion secondary battery (hereinafter written as LiB) or the like has a different characteristic from an original battery cell or original battery, and may not conform to control specifications of the circuit board. As a result, the protecting operation may not be performed normally in the case where the replacing battery cell or replacing battery is connected to the circuit board as described above, and therefore the battery pack apparatus may be in a serious state.

It is desirable to provide a battery pack apparatus including a battery and a circuit board connected to the battery, capable of detecting a battery power line detached from the circuit board, and a method of controlling the battery pack apparatus.

According to an embodiment of the present invention, there is provided a battery pack apparatus including: a battery, a circuit board connected to the battery, and a detecting unit on the circuit board configured to detect a battery power line detached from the circuit board by detecting a battery voltage drop.

According to an embodiment of the present invention, there is provided a method of controlling a battery pack apparatus having a battery and a circuit board connected to the battery, the method including the step of detecting a battery power line detached from the circuit board by detecting a battery voltage drop.

The battery pack apparatus and method of controlling the battery pack apparatus according to embodiments of the present invention are capable of detecting a battery power line detached from a circuit board in a battery pack apparatus including a battery and the circuit board connected to the battery, and capable of permanently prohibiting charge and discharge using the circuit board in the battery pack apparatus.

BRIEF DESCRIPTION OF THE DRAWINGS

FIG. 4 is a flow chart showing processing in a battery pack apparatus according to an embodiment of the present invention, when turning on power; and FIGS. 5A and 5B are flow charts showing processing in a battery pack apparatus according to an embodiment of the present invention, when power supply is stopped.

DESCRIPTION OF THE PREFERRED EMBODIMENTS

Figure 2:
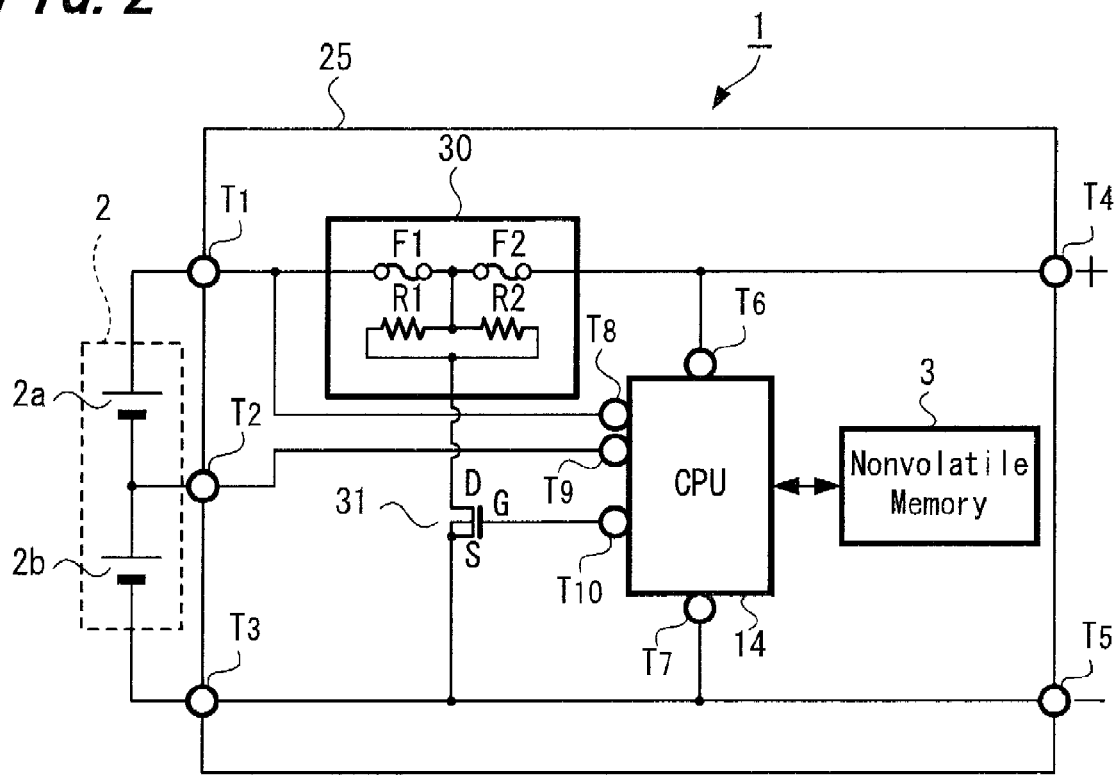
FIG. 2 is a system diagram showing a battery pack apparatus according to an embodiment of the present invention.
Figure 3A:
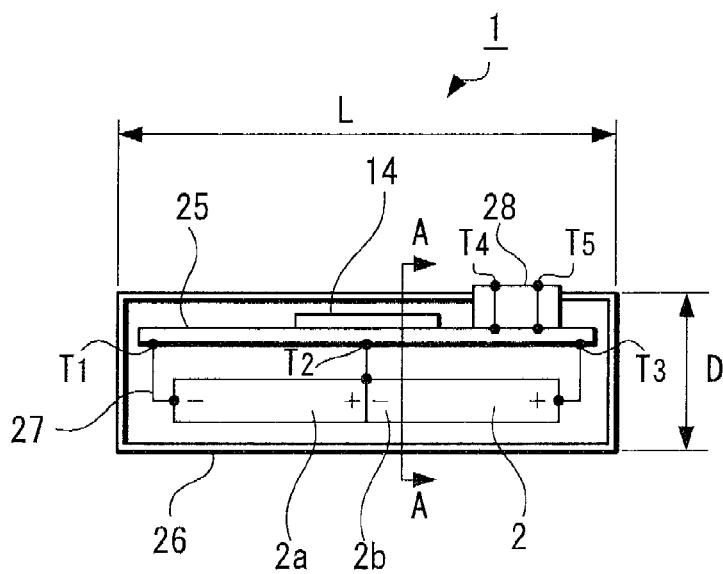
FIGS. 3A and 3B are sectional side views showing relevant parts of a battery pack apparatus according to an embodiment of the present invention.
Figure 3B:
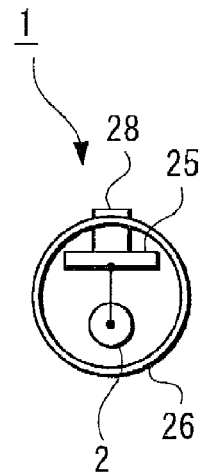

A battery pack apparatus and a method of controlling the battery pack apparatus according to embodiments of the present invention are hereinafter described with reference to FIGS. 2 to 5. FIG. 2 is a system diagram showing a battery pack apparatus according to an embodiment of the present invention. FIGS. 3A and 3B are sectional side views showing relevant parts of a battery pack apparatus according to an embodiment of the present invention. FIG. 4 is a flow chart showing processing steps in a battery pack apparatus and in a method of controlling the battery pack apparatus according to an embodiment of the present invention, when power is turned on. FIGS. 5A and 5B are flow charts showing processing steps in a battery pack apparatus and in a method of controlling the battery pack apparatus according to an embodiment of the present invention, when power supply is stopped.

Figure 1:
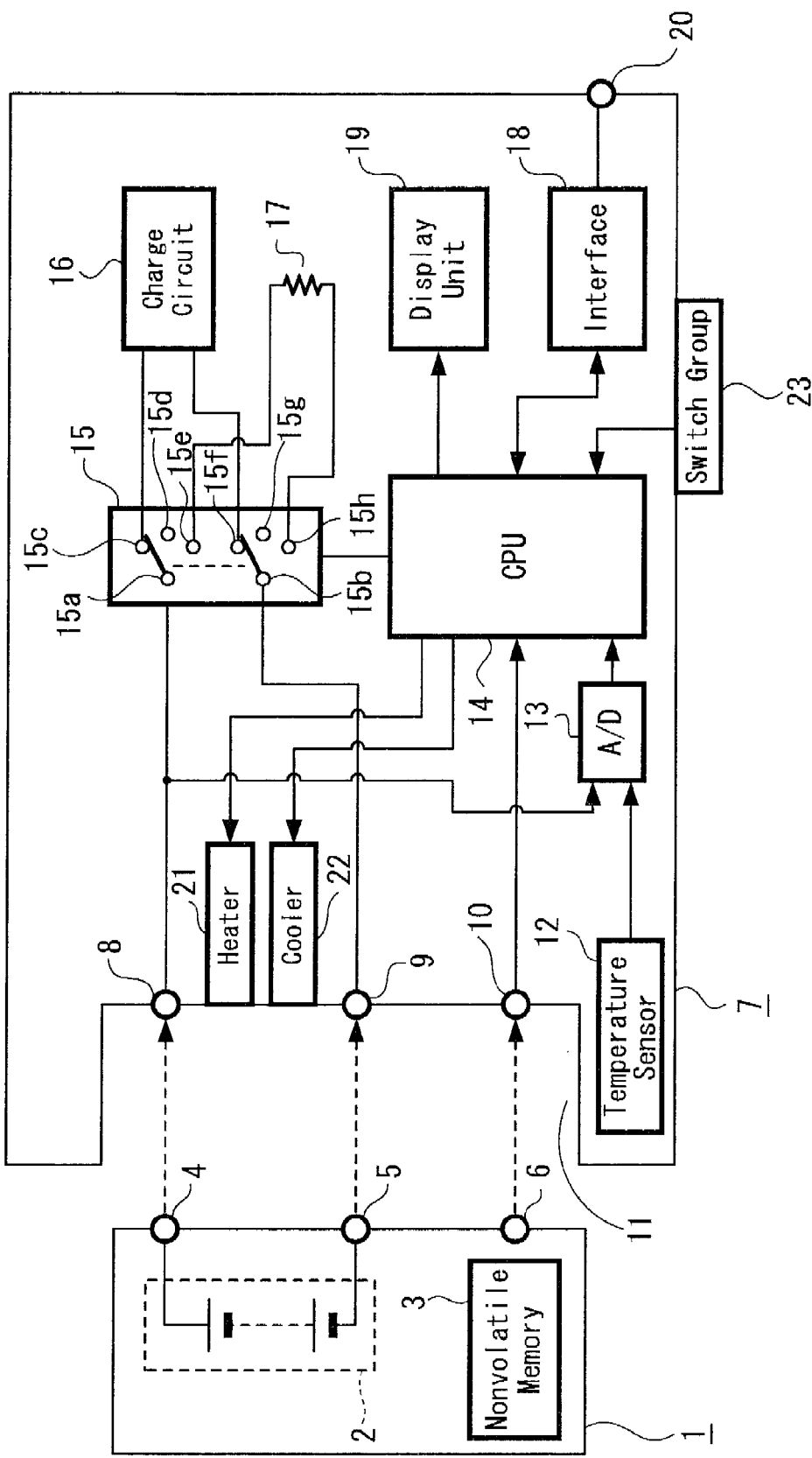
FIG. 1 is a system diagram of a battery apparatus having a nonvolatile memory according to related art.

Prior to describing FIG. 2, relevant parts of a battery pack apparatus are described with reference to FIGS. 3A and 3B. FIG. 3A is a sectional side view of a battery pack apparatus, and FIG. 3B is an A-A line sectional view of FIG. 3A. The same reference numerals are hereinafter given to parts corresponding to those in FIG. 1. A battery pack apparatus (hereinafter described as a battery pack) 1 according to the embodiment includes, for example, a casing 26 incorporating a battery group (battery cell) 2 such as LiB used for a portable CPU, or the like and a circuit board 25 on which an IC such as a CPU is mounted.

The casing 26 is made of, for example, a roughly cylindrical synthetic resin or metal of about 18 Φmm (D)×65 mm (L), includes a battery cell 2 having a plurality of batteries 2a, 2b connected in series, soldered together, and stored in the casing 26 in the lengthwise direction L. The circuit board 25 includes ICs and electrical components, for example, at least a later-mentioned CPU 14, nonvolatile memory 3, heat element-included thermal fuse 30, and the like mounted on a roughly rectangular printed wiring board. As shown in FIGS. 3A and 3B, the circuit board 25 is stored in the casing 26 in the lengthwise direction L in a standing posture so as to face the battery cell 2. A power terminal T1, middle terminal T2 and power terminal T3 in predetermined positions on the circuit board 25 are soldered to the starting end (−), midpoint (+−) and terminal end (+) of the battery cell 2 respectively through wires 27. In addition, a connector 28 is provided for connecting to an electronic apparatus such as a computer.

FIG. 2 is a system diagram of the battery pack 1 according to an embodiment of the present invention. As shown in FIG. 2, the (−) electrode of a first LiB 2a of the battery cell 2 is soldered to the power terminal T1 of a circuit board 25 included in a battery pack 1, and the (+) electrode of a second LiB 2b of the battery cell 2 is soldered to the power terminal T3. The midpoint where the (+) and (−) electrodes of the first and second LiBs 2a and 2b are soldered together is soldered to the middle terminal T2 of the circuit board 25.

The power terminal T1 on the circuit board 25 is connected to one of the terminals of the heat element-included thermal fuse (hereinafter described as SCP) 30 including heat elements R1, R2 and fuses F1, F2, and connected to a control terminal T8 of the CPU 14. Although not shown in the figure, the CPU 14 includes ROM, RAM and the like which incorporate control software. The other terminal of the SCP 30 is connected to a power terminal T6 of the CPU 14 and to an output terminal T4 on the circuit board 25. The middle terminal T2 is connected to a control terminal T9 of the CPU 14. A point connecting the heat elements R1 and R2 of the SCP 30 in series is connected to a drain D of a switching MOSFET 31. A source S of the MOSFET 31 is connected to the power terminal T3, power terminal T7 of the CPU 14, and output terminal T5 on the circuit board 25. A gate G of the MOSFET 31 is connected to a control terminal T10 of the CPU 14. A nonvolatile memory 3 such as an EEPROM is connected to the CPU 14.

The CPU 14 on the circuit board 25 measures a battery voltage of the battery cell 2 or first and second LiBs 2a and 2b, and in the case where the battery cell 2 has been removed from the circuit board 25, supplies a control signal causing the heat elements R1 and R2 of the SCP 30 to generate heat, thereby blowing the fuses F1 and F2. Accordingly, charge and discharge will be permanently impossible if another kind of battery cell 2 is used for the battery pack 1 after removing the original battery cell. The CPU 14 writes various kinds of measurement data into the nonvolatile memory 3 and retrieves such measurement data, thereby detecting a power supply voltage dropped state, and deciding whether to blow the SCP 30 depending on the detected data.

FIGS. 4 and 5 are flow charts provided for describing a method of detecting the battery cell 2 or first and second LiBs 2a, 2b in the battery pack 1 removed from the casing 26. FIG. 4 shows a control flow chart when the battery pack 1 according to an embodiment of the present invention is turned on.

First, stored data written in the nonvolatile memory 3 are read in step S1. Whether power supply was stopped last time by a battery voltage drop is judged in step S2, and in the case of the data retrieved from the nonvolatile memory 3 representing "NO" in step S2, without a discriminating value indicating that a power stop was caused by a battery voltage drop, processing enters step S3. The CPU 14 supplies control data to the gate G of the MOSFET 31 to turn on the MOSFET 31, and heats the heat elements R1 and R2 in the SCP 30 to blow the fuses F1 and F2 in step S3. On this occasion, the blowout in step S3 may be prevented if the data retrieved from the nonvolatile memory 3 indicates a first activation of the circuit board 25. Further, the CPU 14 may store data on the capacity of the battery cell 2 or first and second LiBs 2a, 2b at the time of a power supply being stopped, the total charge and discharge amount, the power supply time, and the like in the nonvolatile memory 3, and prevents the blowout of the fuses F1 and F2 in the SCP 30 from occurring, depending on these values. After step S3 or in the case of "YES" in step S2, a normal operation is carried out in step S4.

FIGS. 5A and 5B illustrate control flow charts at the time of a normal operation and at the time of a power supply stop according to an embodiment of the present invention. In the case of the normal operation in step S4 shown by the dotted line in FIG. 5A, processing proceeds to step S5 where remaining amount of the battery cell 2 is calculated, and fuel gauge processing and the like are performed; and after step S5, processing proceeds to step S6. The CPU 14 judges whether or not the battery voltage of the battery cell 2 has dropped in step S6, and in the case of "NO" indicating that the voltage has not dropped, the processing step returns to step S5, whereas, in the case of "YES" indicating that the voltage has dropped, the processing step proceeds to step S7 shown with the dotted line in FIG. 5B. Accordingly, a stop history is not stored in the normal operation shown in FIG. 5A, in the case where the battery cell 2 has been removed from the circuit board 25.

The CPU 14 writes a stop history to the nonvolatile memory 3 in step S7, then power supply to the CPU 14 is stopped in step S8. Specifically, as illustrated in FIGS. 4, 5A and 5B, if a voltage drop of the battery cell 2 or first and second LiBs 2a, 2b is detected in step S1, the processing proceeds to step S2. If the power-off proves to be caused by a battery voltage drop in step S2, a discriminating value indicating that the power supply stop was caused by a battery voltage drop is written to the nonvolatile memory 3. According to such control, if the battery cell 2 or first and second LiBs 2a, 2b have been removed from the circuit board 25 with a sufficient battery voltage of the battery cell 2, a discriminating value indicating a battery voltage drop is not written to the nonvolatile memory 3, so that the fuses F1 and F2 in the SCP 30 will be blown out when power is turned on next time as described in FIG. 4.

Further, if the battery voltage has dropped due to self-discharge of the battery cell 2 or first and second LiBs 2a, 2b, and the battery power supply of the circuit board 25 has stopped, a discriminating value indicating that the power supply stop was caused by a battery voltage drop is written as described above. Therefore, the fuses F1 and F2 will not be blown and can be used normally when power is turned on next time. Although the LiBs 2a, 2b are used in this embodiment, it should be appreciated that primary batteries such as alkaline-manganese batteries, secondary batteries such as nickel-cadmium batteries, physical batteries such as solar batteries, or fuel batteries can also be used.

As described above, according to an embodiment of the present invention, a battery pack 1 includes a battery cell 2, batteries 2a, 2b, and a circuit board 25 connected to the battery cell 2 and the batteries 2a, 2b. In the case where the battery cell 2 and batteries 2a, 2b are removed from the circuit board 25, a detecting unit configured to detect a power supply voltage drop detects the batteries removed from a power line, and the charge and discharge may be permanently prohibited. Therefore, even if the battery pack 1 is disassembled unexpectedly and another battery cell 2 or other batteries 2a, 2b of different kinds are mounted on the circuit board 25 after product delivery, the circuit board 25 may be permanently prevented from charging and discharging, thereby providing a safe battery pack apparatus and a method of controlling the battery pack apparatus.

Further, according to an embodiment of the present invention, a battery pack apparatus and a method of controlling the battery pack apparatus are provided, in which data on a battery voltage drop detected by a detecting unit configured to detect a power supply voltage drop are written to a nonvolatile memory, and when power is turned on next time, the cause of a power cut can be identified by simply changing software.

Furthermore, according to an embodiment of the present invention, a battery pack apparatus and a method of controlling the battery pack apparatus are provided, in which charge and discharge may be permanently prohibited by the use of data on a battery voltage drop stored in a nonvolatile memory and therefore danger caused by reusing a circuit board in the battery pack apparatus can be eliminated.

It should be understood by those skilled in the art that various modifications, combinations, sub-combinations and alterations may occur depending on design requirements and other factors insofar as they are within the scope of the appended claims or the equivalents thereof.

What is claimed is:

1. A battery pack apparatus comprising:
   a casing;
   a battery within the casing;
   a circuit board within the casing and connected to the battery;
   a thermal fuse within the casing and connected between the battery and an outside of the casing;
   a detecting circuit on the circuit board operatively connected and configured to detect a drop in the voltage of the battery;
   a nonvolatile memory on said circuit board; and
   a data processor on said circuit board in communication with said nonvolatile memory,
   wherein,
      data on the battery voltage drop detected by the detecting circuit are stored in said nonvolatile memory,
      said data processor is placed in a power-off condition after said data on the battery voltage drop are stored in said nonvolatile memory,
      said data processor is configured to read said data upon being placed in a power-on condition, and
      said circuit board includes a configuration to blow said thermal fuse under the control of said data processor if a prior power-off condition was not caused by a voltage drop in said battery.

2. A method of controlling a battery pack, comprising the steps of:
   detecting a battery voltage on a line between the battery and an apparatus connected thereto;
   writing data identifying the occurrence of a detected voltage drop into a nonvolatile memory, if such a drop occurs;
   placing a processor unit in communication with the nonvolatile memory in a power-off condition;
   reading said data from said nonvolatile memory upon placing said processor unit in a power-on condition;
   blowing a thermal fuse if a power-off condition was not caused by a voltage drop in said battery.

* * * * *